United States Patent [19]

Lipinski

[11] Patent Number: 5,406,698

[45] Date of Patent: Apr. 18, 1995

[54] APPARATUS FOR FABRICATING HIGH FIN DENSITY HEATSINKS

[75] Inventor: Joseph Lipinski, Etobicoke, Canada

[73] Assignee: R-Theta Inc., Mississauga, Canada

[21] Appl. No.: 213,075

[22] Filed: Mar. 15, 1994

[30] Foreign Application Priority Data

Oct. 6, 1993 [CA] Canada ................................ 2107869

[51] Int. Cl.[6] ............................................ B23P 15/00
[52] U.S. Cl. ................................... 29/727; 29/890.03
[58] Field of Search .................... 29/727, 33 G, 283.7,
29/890.03; 72/210, 247, 199, 211, 214, 224,
252.5, 67, 68; 492/1, 39

[56] References Cited

U.S. PATENT DOCUMENTS

| | | |
|---|---|---|
| 941,375 | 11/1909 | Loud et al. |
| 2,639,119 | 5/1953 | Greenwald ........................ 253/77 |
| 2,944,326 | 7/1960 | Stadhaus ........................ 29/156.8 |
| 3,077,928 | 2/1963 | Nihlen ........................... 165/180 |
| 3,161,944 | 12/1964 | Schulen ........................... 29/727 |
| 3,216,496 | 11/1965 | Katz ............................. 165/185 |
| 3,261,396 | 7/1966 | Trunk ............................. 165/80 |
| 3,280,907 | 10/1966 | Hoffman ........................ 165/185 |
| 3,312,277 | 4/1967 | Chitouras ...................... 165/185 |
| 4,733,453 | 3/1988 | Jacoby ........................... 29/432 |

FOREIGN PATENT DOCUMENTS

513460 7/1927 Germany.

Primary Examiner—Irene Cuda
Attorney, Agent, or Firm—Sim & McBurney

[57] ABSTRACT

An apparatus for forming a high fin density heatsink from a plurality of fins each having a bottom portion of generally bell-bottom shape and a base unit of predetermined thickness having a plurality of grooves therein. The method includes the steps of placing the plurality of fins loosely in respective ones of the grooves, and applying downward and horizontal pressure to the base unit intermediate respective ones of the fins for swaging the base unit so as to urge the fins downwardly into the respective ones of the grooves thereby creating a solid connection between the base unit and the fins with excellent thermal contact therebetween.

6 Claims, 12 Drawing Sheets

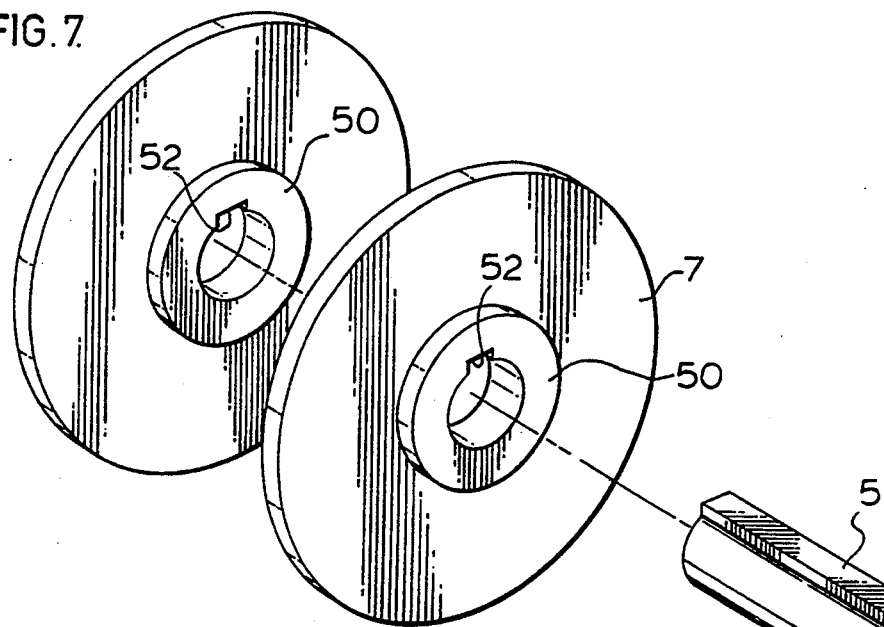
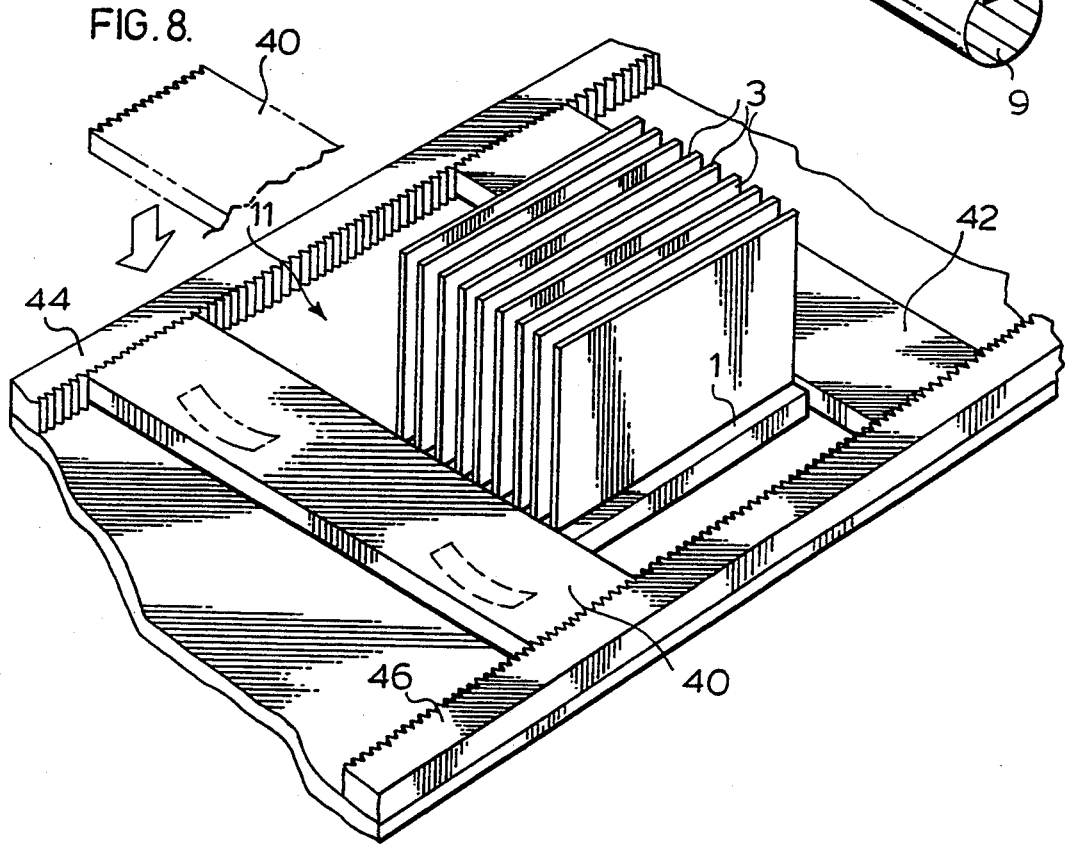

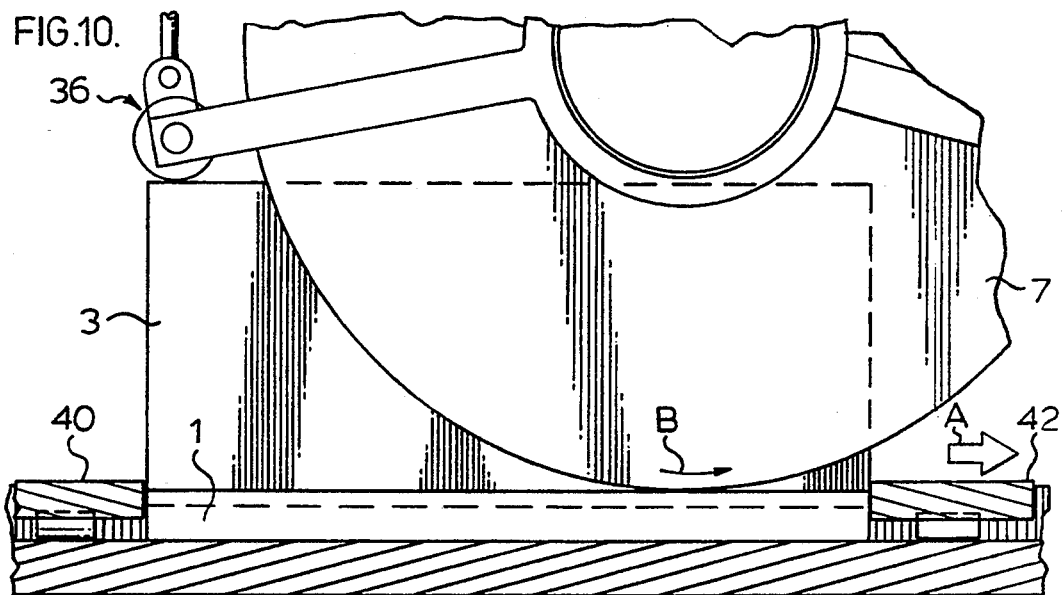
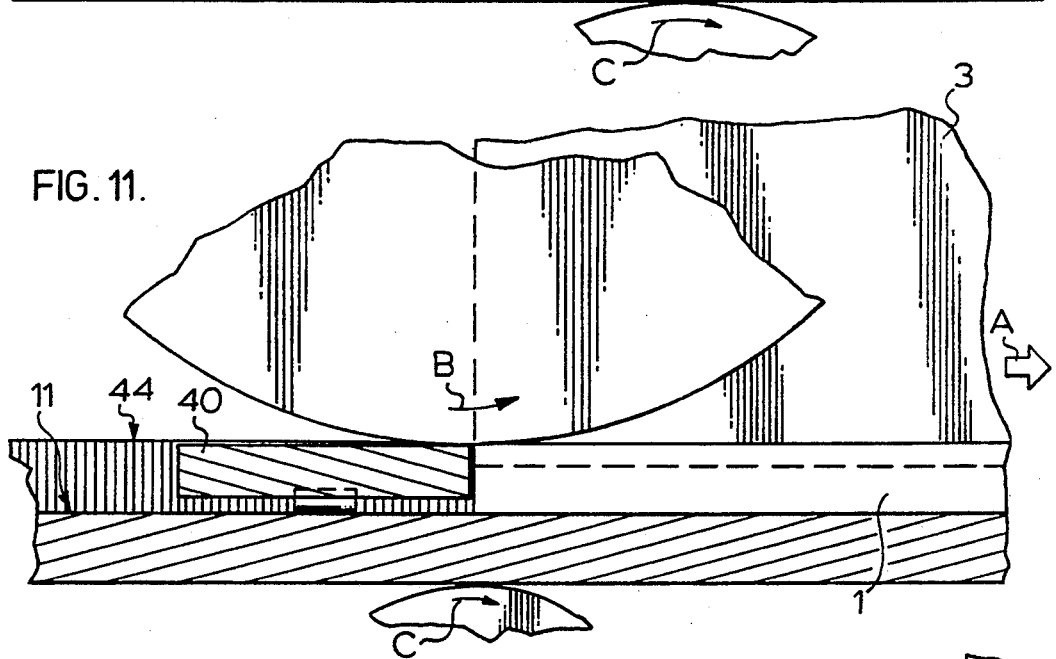
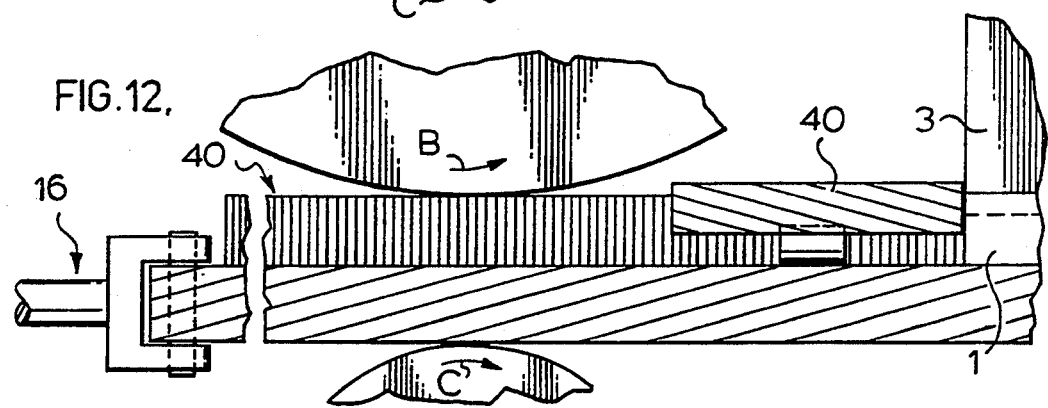

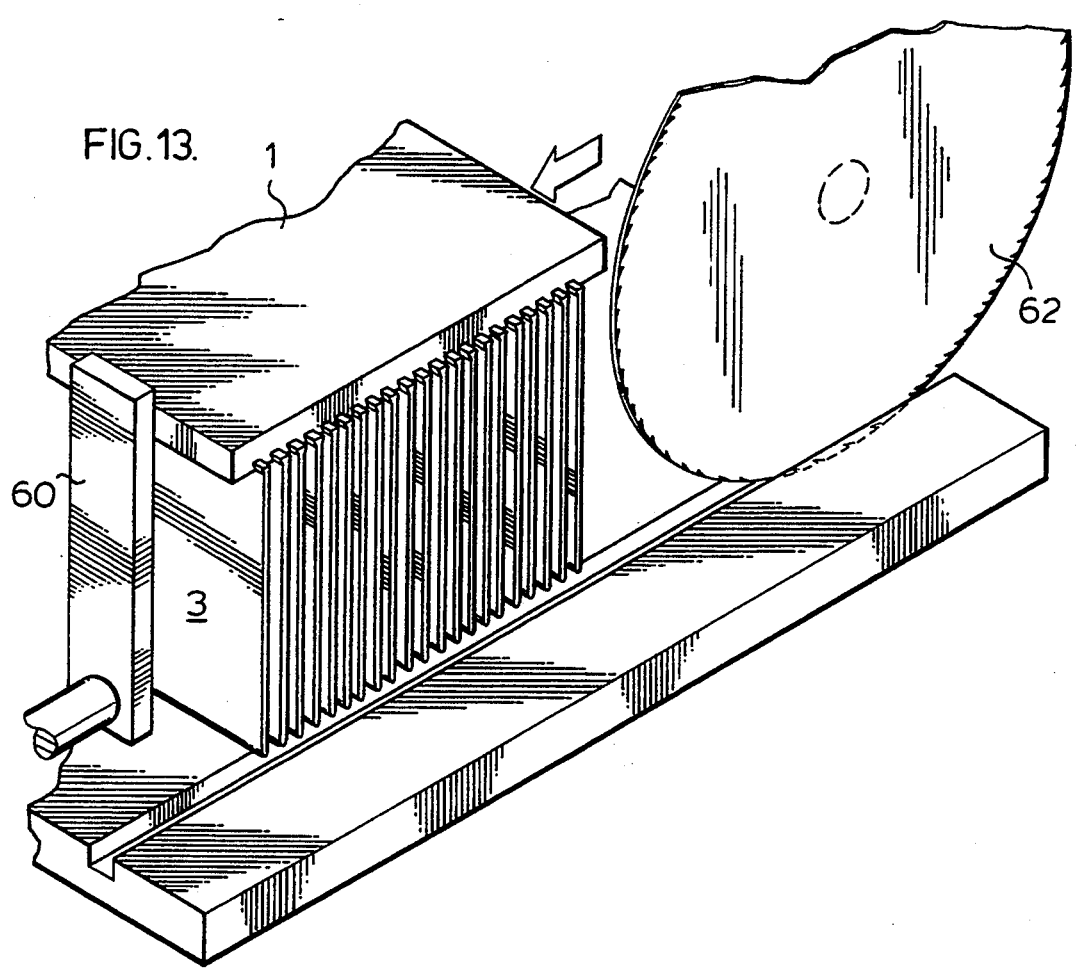

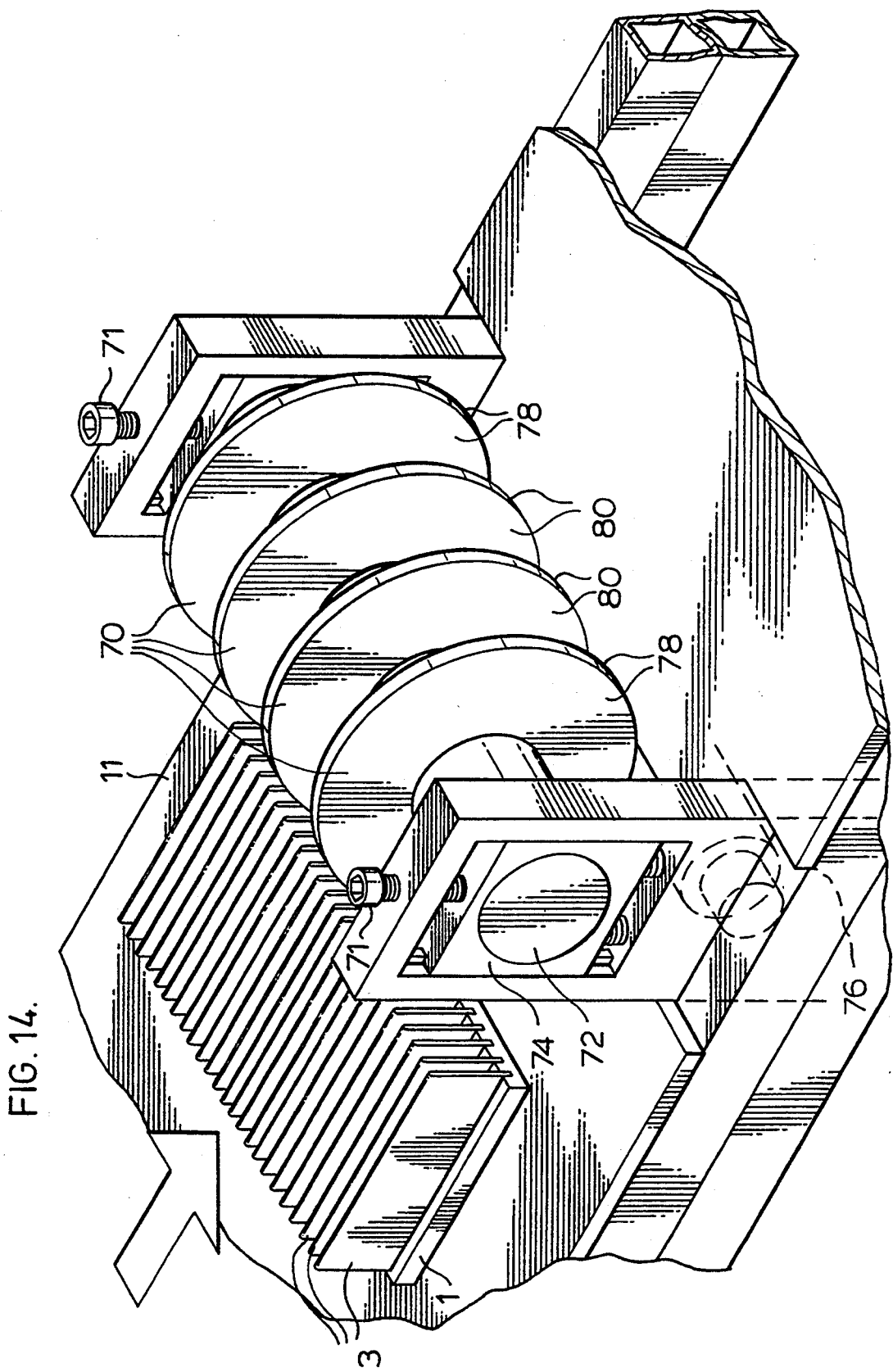

APPARATUS FOR FABRICATING HIGH FIN DENSITY HEATSINKS

FIELD OF THE INVENTION

This invention relates in general to the fabrication of heatsinks, and more particularly to a method and apparatus for fabricating a high fin density heatsink from separately extruded fins and a base unit.

BACKGROUND OF THE INVENTION

It is known in the art to utilize heatsinks for dissipating heat generated by electronic circuits in modern devices. Such well known heatsinks typically comprise a base unit to which the heat generating electronic devices are mounted, and a plurality of fins projecting from the base unit for dissipating the generated heat. It is an object of these heatsinks to maximize the surface area of the fins in order to provide optimum heat transfer from the heat sink to the surrounding atmosphere. It is a further object of well known heatsinks to provide a good thermal contact between the base unit and the fins.

In order to achieve the latter mentioned object, according to known prior art methods, heatsinks have been fabricated by metal extrusion through a die which is cut to the required shape specifications such that the base unit and fins are of integral construction. However, as discussed above, efficiency of operation of such heatsinks is regulated by the surface area and amount of metal used versus the length of each fin. The current design limit for prior art extrusion processes in terms of fin thickness to height, is 3:1 or less. Thus, in the event that, an extruded fin is excessively thin or excessively high, the pressure of the extruded metal has a tendency to destroy the die.

In an effort to overcome the problems of integral extruded heatsinks, and in an effort to provide increased fin density and overall height, certain prior art fabrication methods have used separate extrusion of the base unit and the fins, and subsequent assembly to form the heatsink. For example, U.S. Pat. No. 3,261,396 (Trunk) teaches a method of securing corrugated metal fins to a base unit by means of epoxy cement. Unfortunately, the epoxy gluing method disclosed in the Trunk patent results in poor thermal conductivity between the base unit and respective fins.

U.S. Pat. No. 3,216,496 (Katz) teaches separate fabrication of a bus bar or base unit having, on its flat side, a plurality of slots for receiving separately fabricated fins. The slots extend transversely the length of the bar and are arranged so as to hold the fins in substantially parallel relationship. The fins themselves are strip-shaped and preferably of width equal to that of the bus bar. The fins are joined to the bus bar by means of inserting the fins into the plurality of slots and then swaging the material between adjoining slots into intimate contact with the fins by means of a hydraulic press operating through a knife-edged tool. Unfortunately, the method taught by Katz applies pressure only to the narrow line contacted by the knife-edged tool. This results in the material of the bus bar being pushed to the side of the respective fins which creates an upward pressure tending to lift the fins upwardly from the grooves, thereby leaving an air space at the bottom of the grooves in the bus bar, which allows for air and moisture to enter resulting in corrosion and reducing the thermal contact between the base unit and fins.

Various other patents disclose methods of joining fins to a base unit. For example, U.S. Pat. No. 3,312,277 (Chitouras) and No. 3,280,907 (Hoffman) teach the use of dovetail connections for overcoming extrusion difficulties in fabricating a heat dissipating device with the fins very close together. Additional patents of interest are as follows: U.S. Pat. No. 941,375 (Loud et al); No. 2,639,119 (Greenwald); No. 2,944,326 (Stradthaus et al); No. 3,077,928 (Nihlen et al); and No. 4,733,453 (Jacoby). However, none of the above references teach effective means for overcoming the problem inherent in the Katz fabrication method by which the material of the base unit is pushed upwardly between respective ones of the fins thereby causing the fins to lift upwardly from the grooves.

SUMMARY OF THE INVENTION

According to the present invention, an apparatus and method is provided for fabricating a high fin density heatsink by means of a plurality of rollers for applying pressure on opposite sides of the fin for providing downward and inward swaging against a dovetail joint. In particular, a combination of dovetail fin base and groove is provided with the application of rolling pressure on opposite sides of each fin resulting in vertical and lateral pressure of the base unit material tending to push the fin toward the bottom of the groove in the base. The secure connection between the fins and the base results in good thermal contact therebetween and prevents air and moisture from entering the grooves thereby preventing corrosion and allowing the heatsink to be anodized.

One consequence of swaging is that the vertical pressure has a tendency to warp the base unit upwardly in the middle as a result of displacement of material along the top portion of the base unit during the application of vertical pressure. Therefore, in accordance with a further aspect of the invention, an apparatus is provided comprising a further plurality of rollers for de-warping the base unit.

Various additional aspects of the invention are as follows:

An apparatus for swaging a base unit of predetermined thickness and having a plurality of grooves therein for receiving respective bell-bottom shaped fins to form a high fin density heatsink, said apparatus comprising: a) a planar work surface; b) an axle mounted parallel to said planar work surface; c) a plurality of disks mounted for rotation about said axle and spaced apart a sufficient distance to allow respective ones of said fins to pass therebetween; d) means for adjusting the height of said axle to provide a clearance between the circumference of said disks and said planar work surface which is less than said predetermined thickness of said base unit, such that upon advancing said base unit through said clearance respective ones of said disks apply downward and horizontal pressure to said base unit intermediate respective ones of said fins for swaging said base unit so as to urge said fins downwardly into respective ones of said grooves thereby creating a secure connection between said base unit and said fins with good thermal contact therebetween.

A de-warping apparatus for straightening a plate which is bent such that a centre portion thereof is higher than outer porions thereof, comprising:
 a) a plurality of rollers forming a support surface, centre most ones of said rollers being mounted lower than outer most ones of said rollers;

b) an axle mounted above said rollers;
c) a plurality of disks mounted for rotation about said axle, centre most ones of said disks having larger radius than outer most ones of said disks; and
d) means for advancing said plate between said rollers and disks, whereby a greater downward force is applied to the centre portion of said plate than to said outer portions for de-warping said plate.

A method of forming a high fin density heatsink from a plurality of fins each having a bottom portion of generally bell-bottom shape and a base unit of predetermined thickness having a plurality of grooves therein comprising the steps of: a) placing said plurality of fins loosely in respective ones of said grooves; and b) applying downward and horizontal pressure to said base unit intermediate respective ones of said fins for swaging said base unit so as to urge said fins downwardly into said respective ones of said grooves thereby creating a secure connection between said base unit and said fins with good thermal contact therebetween.

BRIEF DESCRIPTION OF THE DRAWINGS

A detailed description of the preferred embodiments is provided below with reference to the following drawings, in which:

FIG. 7 is a perspective view showing mounting of the rollers on an axle;

FIG. 8 shows a portion of the apparatus of FIG. 3 for securing the base unit prior to swaging;

FIGS. 10, 11 and 12 are cross-sectional side views similar to FIG. 9 which, in combination, show the passage of a base unit and fins through the apparatus of FIG. 3;

FIG. 13 is a perspective view showing a saw for trimming end portions of the fins which extend beyond the sides of the base unit after swaging;

FIG. 14 is a perspective view of an apparatus for de-warping the base unit after swaging, in accordance with another aspect of the present invention;

DETAILED DESCRIPTION OF THE PREFERRED EMBODIMENT

Figure 1:
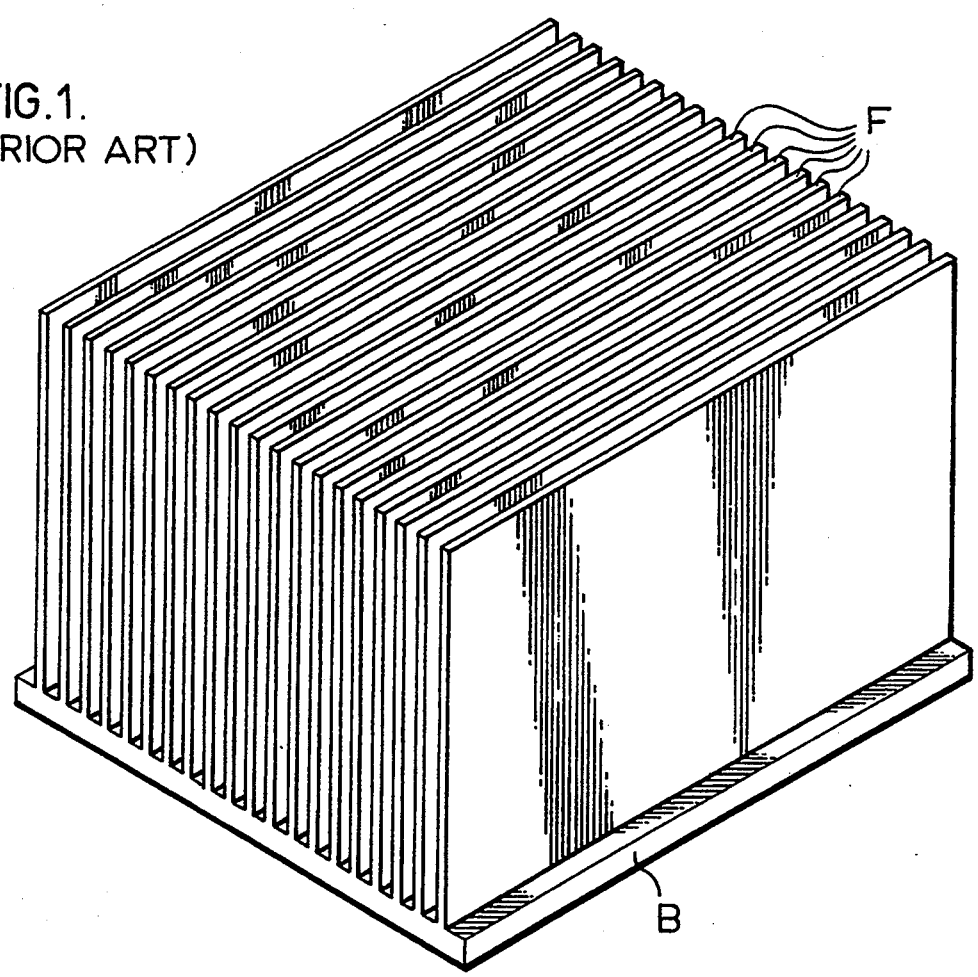
FIG. 1 is a perspective view of a heatsink manufactured in accordance with the principles of the present invention.

With reference to FIG. 1, a heatsink is shown which has been fabricated in accordance with the prior art. In this prior art heatsink a base unit B and a plurality of fins F projecting perpendicularly therefrom, are extruded as an integral unit using well known extrusion techniques and apparatus. However, as discussed above, such prior art extrusion techniques are incapable of producing high fin density heatsinks.

Figure 2:
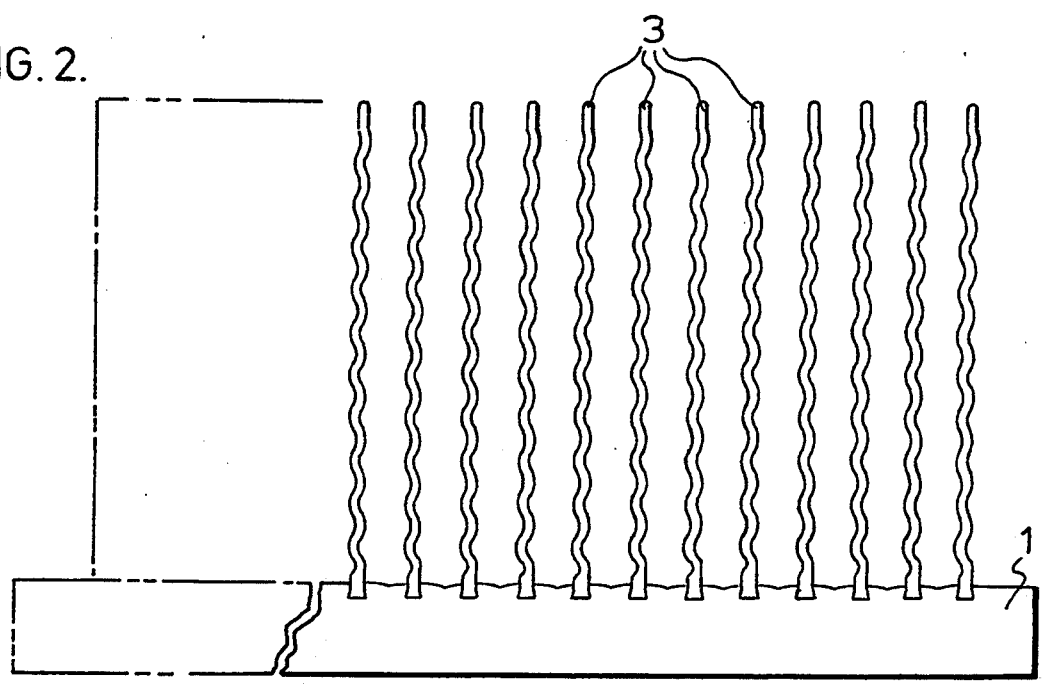
FIG. 2 is a partially broken elevation view of the heatsink of FIG. 1 following a swaging operation according to the present invention, showing a dovetail connection of base unit having grooves for receiving bell-bottom shaped fins.

Turning to FIG. 2, a heatsink is shown which has been fabricated using the apparatus and method of the present invention. The inventive heatsink comprises a base 1 and a plurality of fins 3 which are swaged into respective parallel grooves in the top surface of the base unit 1, as discussed in greater detail below. In the illustrated embodiment, the fins 3 are shown as having a generally serpentine profile for increasing the heat dissipating surface area. However, the fins 3 may be made flat for certain applications.

Figure 4:
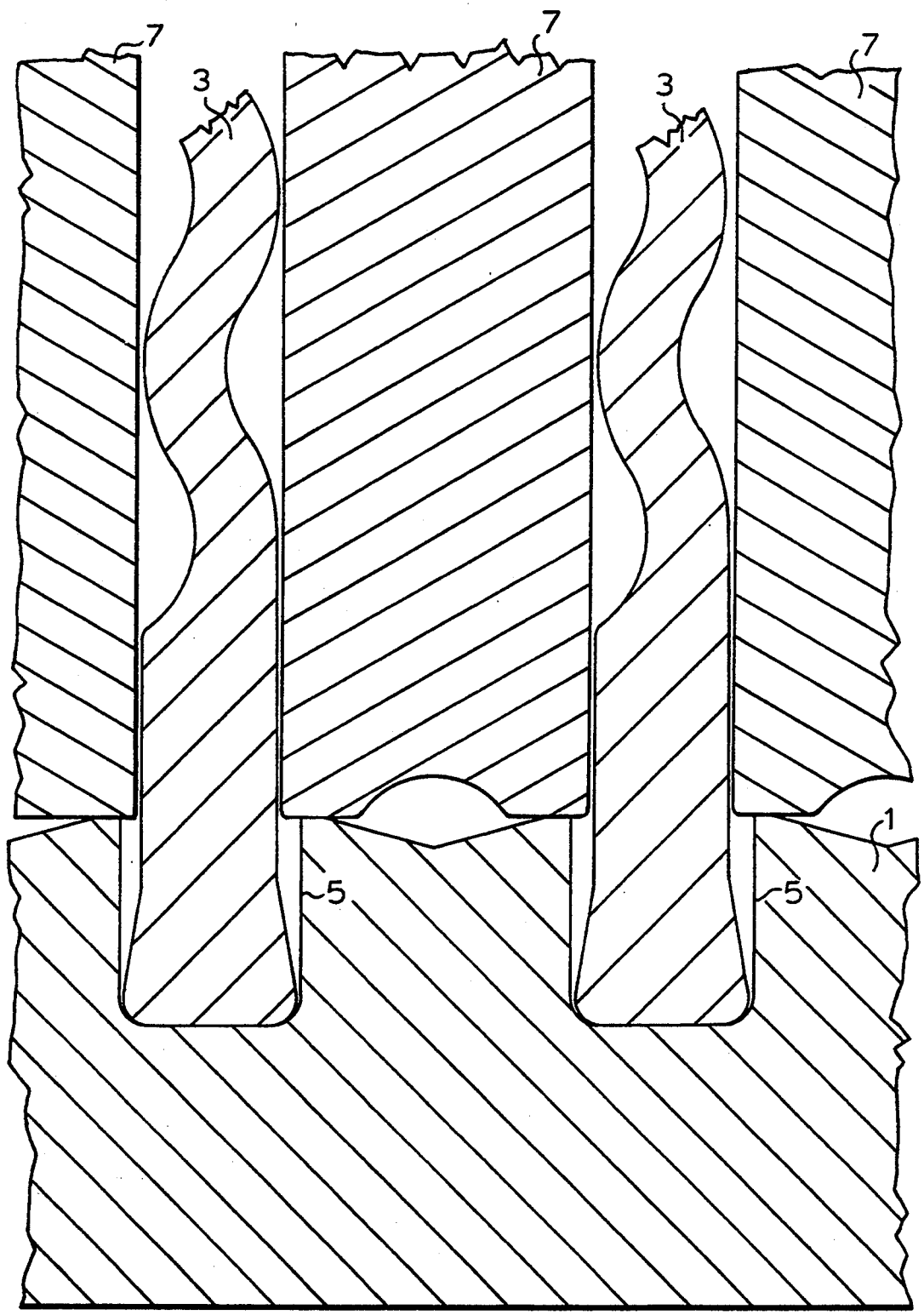
FIG. 4 is a detail elevation view showing the positioning of a plurality of rollers of the apparatus of FIG. 3 relative to the base unit and respective fins in accordance with the preferred embodiment.

Turning momentarily to FIG. 4, the base unit 1 is shown in greater detail comprising a plurality of parallel generally rectangular grooves 5, each of the grooves 5 incorporating rounded corners at a lower portion thereof. It has been found that extrusions of the base portion 1 in accordance with the design of FIGS. 2 and 4 is both simple and inexpensive. The fin 3 is shown with reference to FIG. 4 having a flanged bell-bottom lower portion. Thus, in accordance with the method of the present invention, the plurality of fins 3 and base unit 1 are separately extruded, and thereafter combined by inserting respective ones of the fins 3 into the grooves and thereafter crimping or swaging the fins 3 into the grooves for forming a dovetail connection by virtue of the respective flange portions, as discussed in greater detail below.

Figure 3:
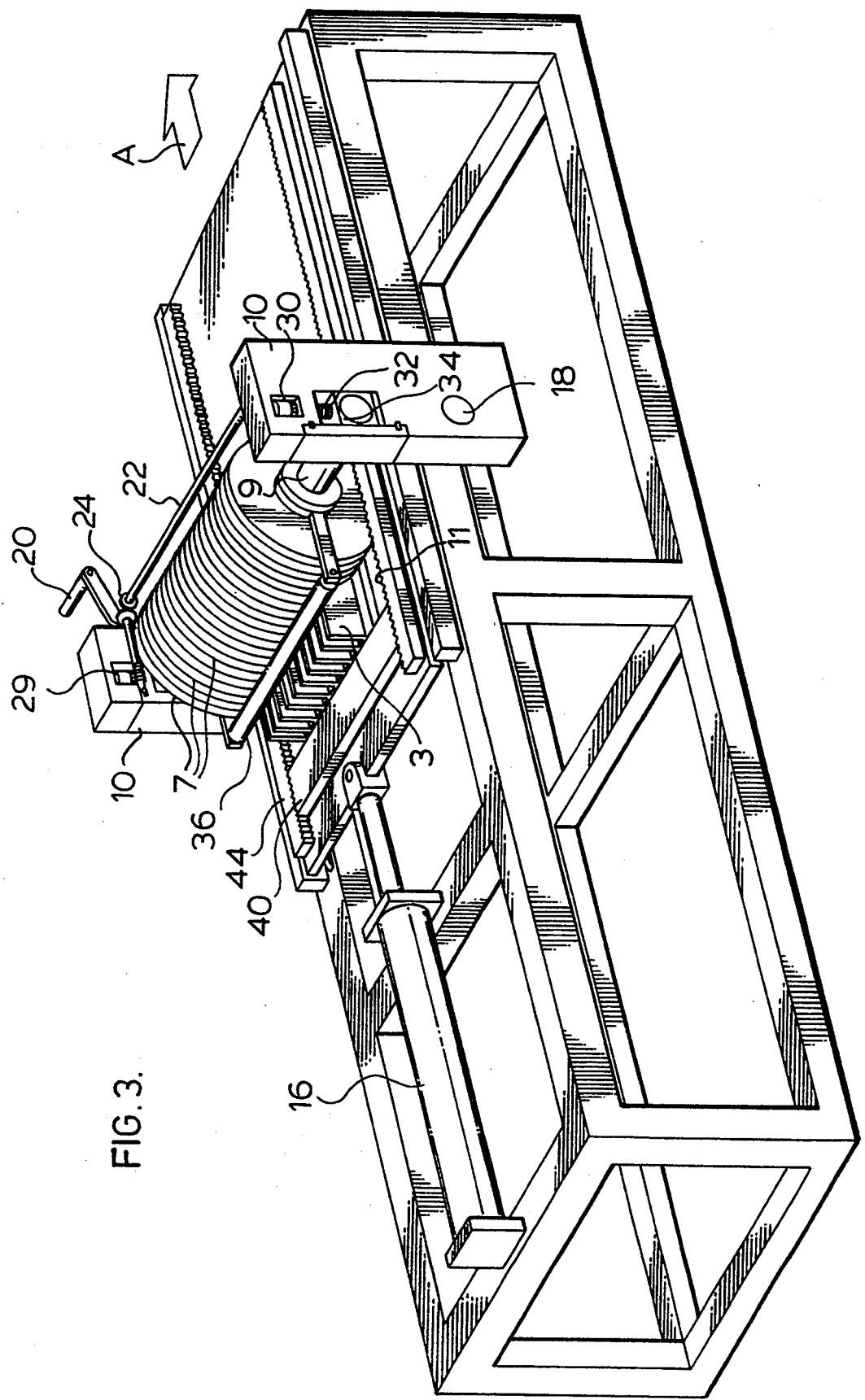
FIG. 3 is a perspective view of an apparatus for swaging the base unit and fins to form the heatsink of FIG. 1.
Figure 5:
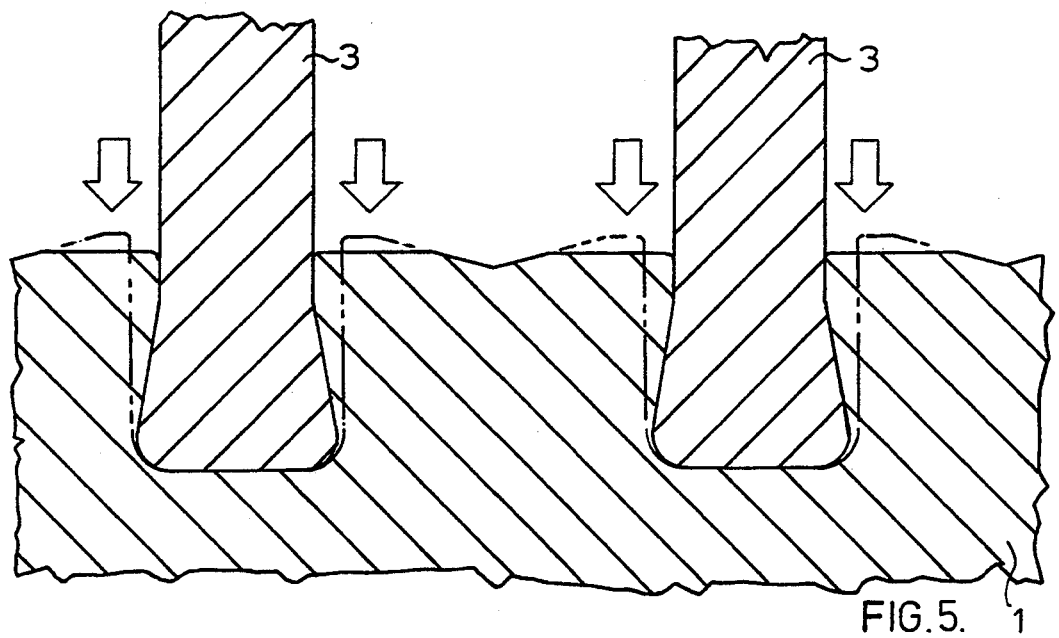
FIG. 5 is a similar view to FIG. 4 after swaging, wherein the rollers are omitted for clarity.

Turning to FIG. 3, in combination with FIGS. 4 and 5, the apparatus according to the present invention is shown for fabricating high fin density heatsinks, comprising a plurality of disks 7 mounted to an axle 9. The axle 9 is mounted for rotation in a pair of adjustable height mounting blocks 10. The disks are spaced apart a predetermined distance equivalent to the distance between successive ones of the plurality of grooves 5. The clearance between the lower most portion of the circumference of the disks 7 and the top of the working surface 11 (FIG. 8) is adjusted to be slightly less than the thickness of the base unit 1.

Preferably, each of the disks 7 has a width approximately equal to but no greater than the distance between successive ones of the plurality of grooves 5 minus the width of each of the fins 3.

Figure 9:
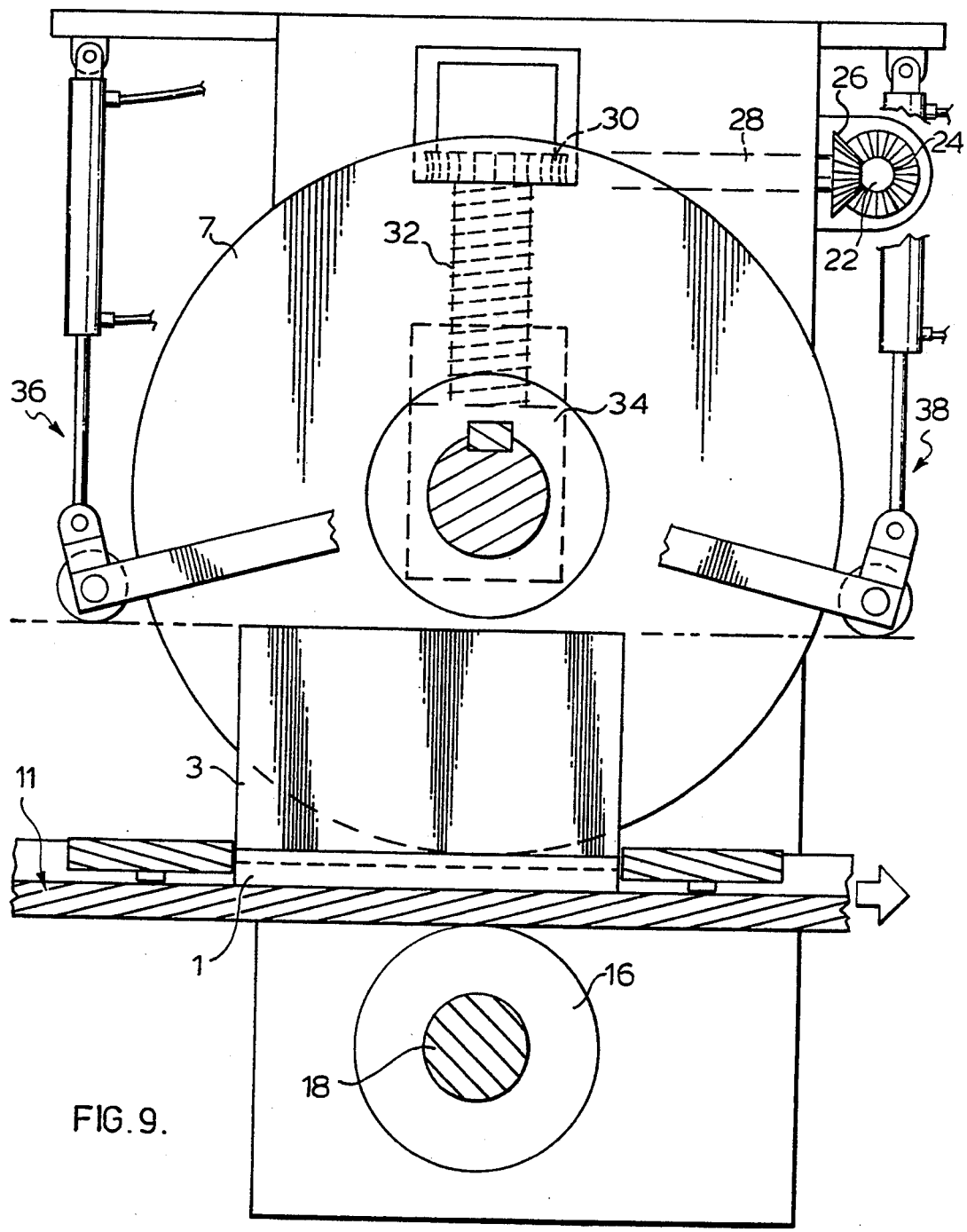
FIG. 9 is a cross-sectional side view of the apparatus of FIG. 3 showing means for adjusting the axle height and details of the axle support construction.

With reference to FIG. 9, the working surface 11 which supports the base unit 1 while it passes beneath the disks 7 is, in turn, supported by a roller 16 mounted to a second axle 18 which is also mounted in blocks 10.

The height of the axle 9, and hence the clearance between the disks 7 and working surface 11, may be adjusted by turning the handle 20 (FIG. 3), which is connected to a rod 22 having a pair of geared wheels 24 (only one such wheel being shown in FIGS. 3 and 9). The wheels 24 engage respective cooperatively shaped wheels 26 each mounted to a further rod 28 (only one such wheel and rod being shown in FIGS. 3 and 9).

Each rod 28 has, at an end opposite to the geared wheel 26, a threaded portion 29 (FIG. 3) which engages a gear wheel 30 of a threaded bolt member 32. Upon turning the handle 20, the rod 22 rotates, causing rods 28 to rotate as a result of interaction between geared wheels 24 and 26. This, in turn, causes the gear 30 and threaded bolt 32 to rotate within mounting block 20. The axle 9 is housed within a riser block 34 which has internal threads for receiving the threaded bolt 32. Thus, in response to rotation of the threaded bolt 32, the riser block 34 may be raised or lowered. According to the preferred embodiment, one rotation of handle 20 results in a axle height adjustment of approximately of $2.5 \times 10^{-3}$ inches.

Also shown in FIG. 9 is a pair of pneumatically controlled rollers 36 and 28 which are adapted to rest on top of the fins 3 as they pass through disks 7. The rollers 36 are required to securely hold down the fins 3 in the grooves 5 before pressure is applied during swaging. The rollers 38 are required to prevent the fins 3 from rolling upwardly and around the disks 7 after swaging.

Figure 6:
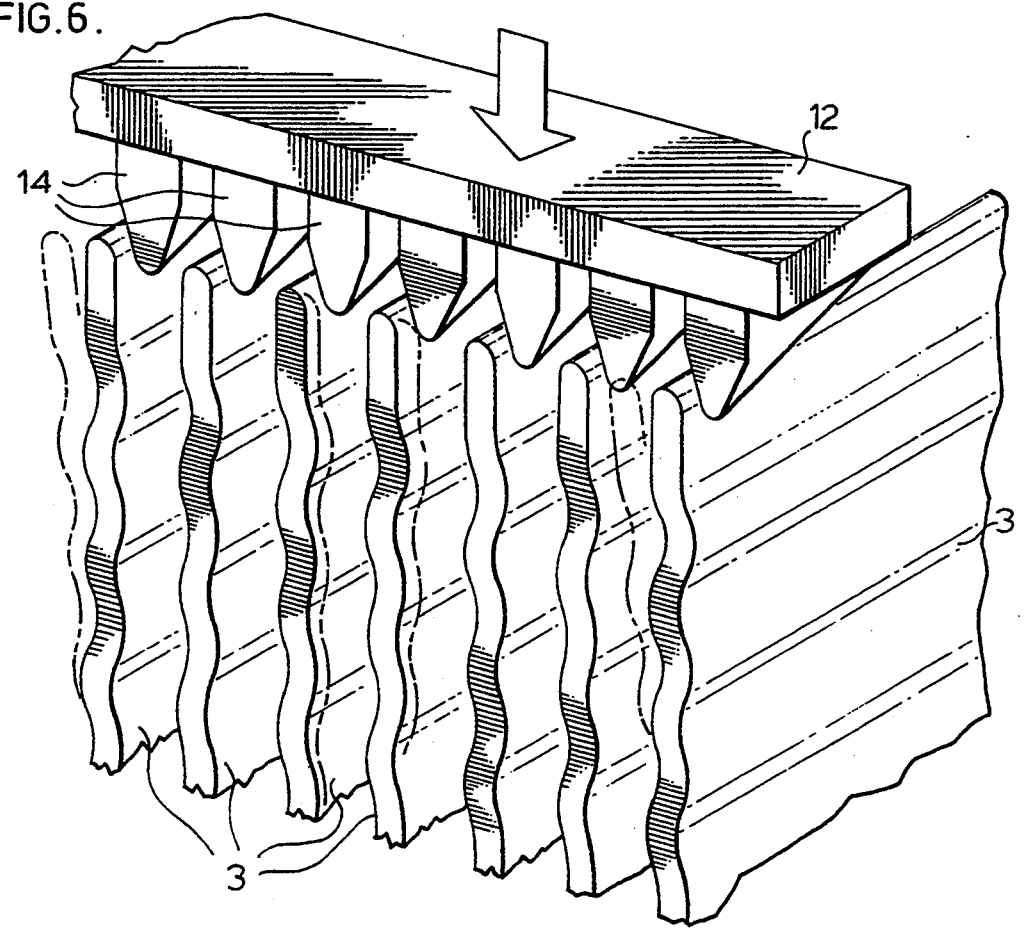
FIG. 6 shows an apparatus for aligning the fins prior to swaging, in accordance with the preferred embodiment.

In operation, the fins are loosely placed in the grooves 5 of base unit 1. The fins 3 are then aligned relative to the spaces between respective disks 7 by means of the alignment tool 12 shown in FIG. 6. This tool comprises a plurality of teeth 14 spaced at equivalent intervals to the disks 7. In FIG. 6, the non-aligned positions of the fins 3 are shown in phantom.

The loosely assembled unit is then advanced into the apparatus of FIG. 3 by means of a pneumatic drive 16, such that respective ones of the fins 3 pass between respective disks 7, as shown in FIG. 4. As the loosely assembled unit is advanced in the direction of arrow A in FIGS. 10, 11 and 12, the disks rotate in the direction of arrow B and the roller 16 rotates in the direction of arrow C, such that the lower most circumference portions of the disks 7 apply pressure to the regions of base unit 1 intermediate respective ones of the fins 3 for swaging the metal material in these regions to thereby crimp the fins 3 firmly in place. The pressure provided by the apparatus of FIG. 3 on block 1 may be adjusted by careful selection of the height of the axle 9.

The base unit 1 is held in place on working surface 11 by a pair of positioning bars 40 and 42 which are shown in detail with reference to FIG. 8. A pair of toothed side retention members 44 and 46 project upwardly from the working surface 11, and are adapted to receive cooperatively shaped toothed end portions of the positioning bars 40 and 42. Thus, the base unit 1, with fins 3 is held firmly in place on the working surface 11 while the fins 3 are swaged into the base unit 1 under pressure of disks 7. Turning to FIG. 7, each of the disks is shown comprising a raised circular hub portion 50 of predetermined thickness against which an adjacent one of the plurality of disks rests. The predetermined thickness of the raised circular hub portion defines the distance between respective ones of the disks 7. Each raised circular hub 50 has a keyway in the form of a rectangular slot 52 therein for receiving a cooperatively shaped rectangular key 54 projecting from the axle 9, in order to mount the disks 7 for rotation in conjunction with axle 9.

The dovetail connection between the groove 5 and bell-bottom shaped fin 3 of the present invention, in conjunction with the use of disk 7 applying pressure vertically downward on base unit 1, results in the fins 3 being pushed downwardly by the displaced base unit material (shown in phantom with reference to FIG. 5), and into tight engagement with the corresponding grooves 5.

As a result of the swaging operation according to the present invention, the fins 3 often become displaced laterally with reference to the base unit 1. Therefore, according to the present invention, as shown in FIG. 13, the heatsink is inverted and secured in a mounting device 60 and a rotary blade 62 is used to cut through the excess portions of the fins 3 for trimming such access portions off of the heatsink, in a straight forward manner.

Turning now to FIG. 14, the apparatus for de-warping the base unit 1 is shown comprising a plurality of pairs of disks 70 mounted to axle 72 which, in turn, is housed in an axle block 74. The height of axle block 74, and hence also of axle 72, is adjustable by means of threaded bolts 71.

Figure 15:
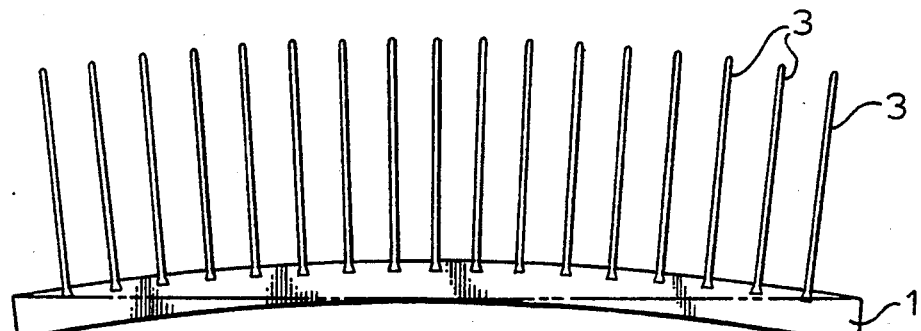
FIG. 15 is a front view of the warped base unit subsequent to swaging but prior to de-warping in accordance with the apparatus of FIG. 14.
Figure 16:
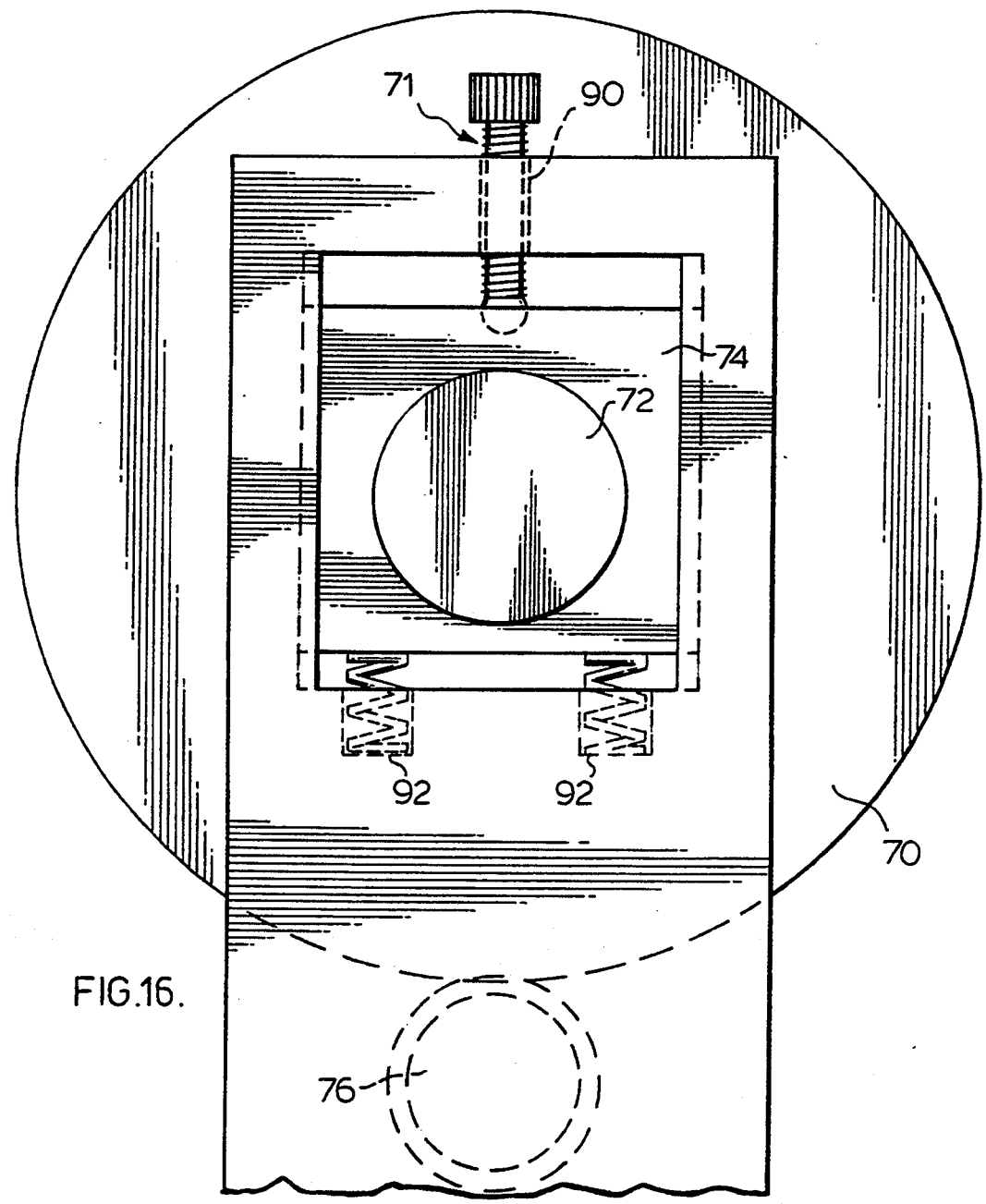
FIG. 16 is a side view of the apparatus of FIG. 14.

As the heat sink passes beneath and between rollers 70, the base unit 1 is supported from beneath by a plurality of sub-rollers (shown in phantom with reference numeral 76 in FIGS. 14 and 16). The diameter of the outer two disk pairs 78 is made less than the diameter of the inner two disk pairs 80 so that with base unit 1 supported on rollers 76, the inner disk pairs 80 exert a greater force on the center portion of the warped base 1 than outer disk pairs 78 for flattening the warped base unit 1 from the position shown in solid lines to the flattened shape shown in phantom with reference to FIG. 15.

Turning briefly to FIG. 16, the axle block 74 is shown supported from beneath by a pair of coil springs 92. As discussed above, the threaded bolt 71 controls the height of axle block 74 relative to the roller 76. More particularly, the bolt 71 is threaded into an internal threaded hole 90 and a portion of the bolt 71 contacts an upper portion of the axle block 74 for applying equal and opposite pressure to the coil springs 92.

Figure 17A:
FIGS. 17A, 17B, 17C and 17D show the various stages of warping and de-warping of the base unit as a result of the apparatuses of FIGS. 3 and 14.
Figure 17B:
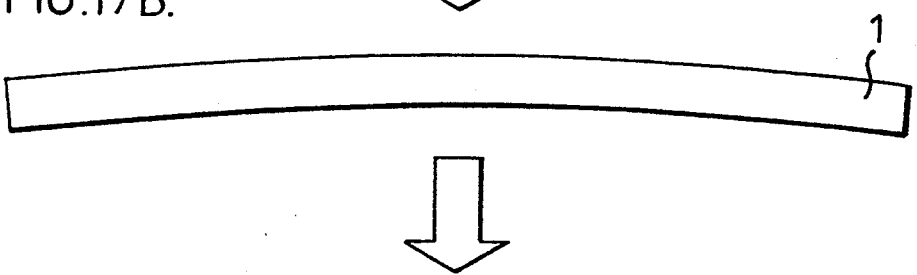
Figure 17C:
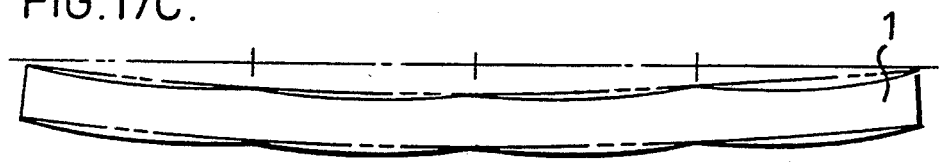
Figure 17D:
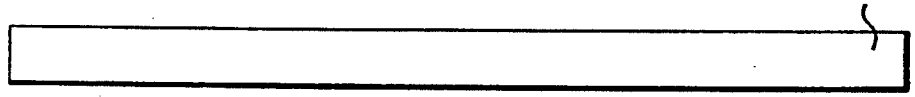

Turning briefly to FIGS. 17A–17D, the various warped and de-warped shapes of the base unit 1 are shown schematically. With reference to FIG. 17A, the base unit 1 shown in its initial flat configuration. In FIG. 17B, the base unit 1 is shown warped upwardly in the center as a result of the swaging operation discussed in greater detail above with reference to FIG. 3. In FIG. 17C, the shape of base unit 1 is illustrated schematically to show how the pressure of disk 70 on the top surface thereof as the heat sink passes through the de-warping apparatus of FIG. 14. FIG. 17D shows the base unit 1 after de-warping, which is similar to the initial flat shape of the base unit 1.

Figure 18:
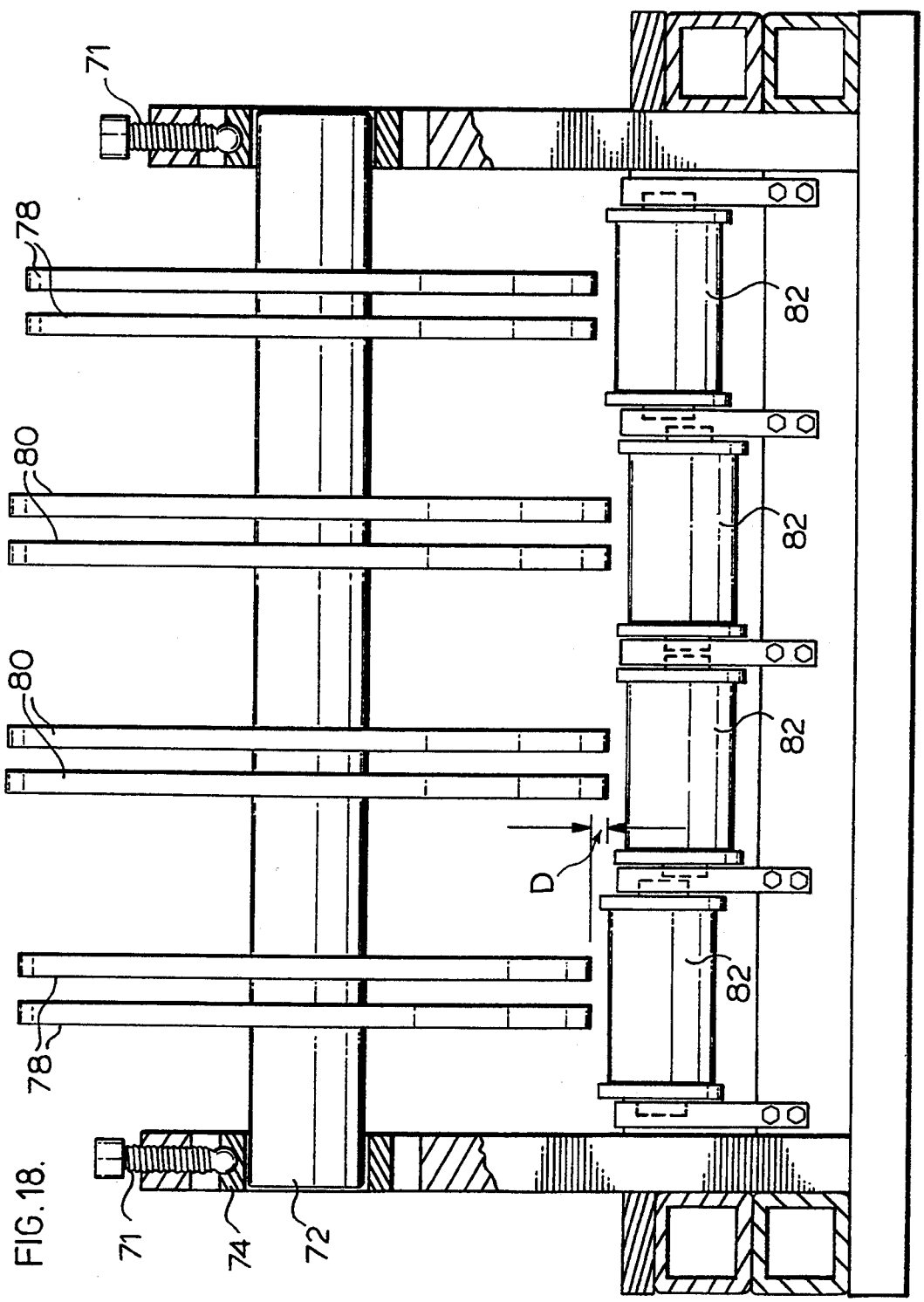
FIG. 18 is a front view, partially in section, of the apparatus of FIG. 14.

Turning now to FIG. 18, the rollers 76 discussed above with reference to FIG. 14 are shown in detail comprising a series of interconnected sub-rollers 82 positioned so as to provide a constant clearance D between respective ones of the pairs of disks 78 and 80 and the associated sub-rollers 82, for effecting the de-warping discussed above in connection with FIG. 17C. Thus, as shown in FIGS. 17C and 18, the base unit 1 is flexed downwardly in the middle relative to the outer edges of the base unit 1, for de-warping the base unit.

In summary, the method and apparatus of the present invention result in low cost fabrication of high fin ratio heatsinks, (eg. 6:1, 8:1, 10:1 and greater). The heatsinks are characterized by high thermal contact between the base unit and fins with no moisture or air therebetween, thus preventing corrosion and permitting the part to be anodized.

Other modifications and variations of the invention are possible within the sphere and scope of the claims appended hereto.

I claim:

1. Apparatus for swaging a base unit of predetermined thickness and having a plurality of grooves therein for receiving respective bell-bottom shaped fins to form a high fin density heatsink, said apparatus comprising:
    a) a planar work surface;
    b) an axle mounted parallel to said planar work surface;
    c) a plurality of disks mounted for rotation about said axle and spaced apart a sufficient distance to allow respective ones of said fins to pass therebetween;
    d) means for adjusting the height of said axle to provide a clearance between the circumference of said disks and said planar work surface which is less than said predetermined thickness of said base unit, such that upon advancing said base unit through said clearance respective ones of said disks apply downward and horizontal pressure to said base unit intermediate respective ones of said fins for swaging said base unit so as to urge said fins downwardly into respective ones of said grooves thereby creating a secure connection between said base unit and said fins with good thermal contact therebetween.

2. The apparatus of claim 1 wherein said sufficient distance between successive ones of said disks is equivalent to the distance between successive ones of said plurality of grooves.

3. The apparatus of claim 2 wherein each of said disks has a width approximately equal to and no greater than said distance between successive ones of said plurality of grooves minus the width of each of said fins.

4. The apparatus of claim 1, wherein each of said plurality of disks further comprises a raised circular hub portion of predetermined thickness against which an adjacent one of said plurality of disks rests, said predetermined thickness defining said sufficient distance of spacing between respective ones of said disks.

5. The apparatus of claim 4, wherein said raised circular hub has a keyway in the form of a rectangular slot therein for receiving a cooperatively shaped key projecting from said axle for mounting said plurality of disks thereto.

6. The apparatus of claim 1, wherein said means for adjusting the height of said axle further comprises a pair of threaded mounting blocks for receiving said axle, gear means connected to each of said threaded mounting blocks, and a handle connected to said gear means such that upon turning said handle said gear means causes each of said threaded mounting blocks to move vertically for raising and lowering said axle.

* * * * *